(12) United States Patent
Zhao et al.

(10) Patent No.: US 10,287,686 B2
(45) Date of Patent: May 14, 2019

(54) HOT PLATE AND SUBSTRATE PROCESSING EQUIPMENT USING THE SAME

(75) Inventors: Mengxin Zhao, Beijing (CN); Xu Liu, Beijing (CN); Peijun Ding, Beijing (CN); Hougong Wang, Beijing (CN); Wei Xia, Beijing (CN); Lihui Wen, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 910 days.

(21) Appl. No.: 13/992,165

(22) PCT Filed: Nov. 23, 2011

(86) PCT No.: PCT/CN2011/082730
§ 371 (c)(1),
(2), (4) Date: Jun. 6, 2013

(87) PCT Pub. No.: WO2012/075886
PCT Pub. Date: Jun. 14, 2012

(65) Prior Publication Data
US 2013/0269614 A1  Oct. 17, 2013

(30) Foreign Application Priority Data
Dec. 6, 2010 (CN) .......................... 2010 1 0585727

(51) Int. Cl.
*C23C 16/44* (2006.01)
*C23C 16/46* (2006.01)
(Continued)

(52) U.S. Cl.
CPC .............. *C23C 16/46* (2013.01); *C23C 14/02* (2013.01); *H01L 21/67103* (2013.01)

(58) Field of Classification Search
CPC ......... H01L 21/67103; H01L 21/67115; H01L 21/67248; C23C 16/46; H05B 3/0047–3/0052
See application file for complete search history.

(56) References Cited

U.S. PATENT DOCUMENTS 5,217,600 A * 6/1993 Le ........................... C25D 11/08
205/328
5,551,985 A * 9/1996 Brors ..................... C23C 16/455
118/715

(Continued)

FOREIGN PATENT DOCUMENTS

CN     1601732 A    3/2005
CN   101533797 A    9/2009

(Continued)

OTHER PUBLICATIONS

International Search Report of PCT/CN2011/082730.

*Primary Examiner* — Charlee J C Bennett
(74) *Attorney, Agent, or Firm* — Anova Law Group, PLLC (57) ABSTRACT

The present invention provides a hot plate and substrate processing equipment using the same, wherein the hot plate comprises a central sub hot plate and at least one outer ring sub hot plate located around the central sub hot plate; thermal insulation parts are provided between the central sub hot plate and the outer ring sub hot plate and between two adjacent outer ring sub hot plates, so that the heat conduction between the adjacent sub hot plates can be effectively prevented or reduced by means of the thermal insulation parts. The hot plate and the substrate processing equipment using the same provided in the present invention can effectively compensate for the heat losses in the edge region of the substrate, so as to keep the heating rate the same in each region of the substrate.

15 Claims, 4 Drawing Sheets

(51) Int. Cl.
*H01L 21/67* (2006.01)
*C23C 14/02* (2006.01)

(56) References Cited

U.S. PATENT DOCUMENTS

| | | | | |
|---|---|---|---|---|
| 5,763,856 | A * | 6/1998 | Ohkase | C23C 16/481 |
| | | | | 118/725 |
| 6,054,688 | A * | 4/2000 | Moschini | H01L 21/67109 |
| | | | | 118/725 |
| 9,023,721 | B2 * | 5/2015 | Arena | H01L 21/0254 |
| | | | | 257/E33.025 |
| 2003/0183612 | A1 * | 10/2003 | Timans | C30B 31/12 |
| | | | | 219/390 |
| 2004/0065656 | A1 * | 4/2004 | Inagawa | C23C 16/4586 |
| | | | | 219/444.1 |
| 2004/0099651 | A1 * | 5/2004 | Johnson | F27B 17/0025 |
| | | | | 219/390 |
| 2007/0279315 | A1 * | 12/2007 | Laves | G06F 1/1615 |
| | | | | 345/1.1 |
| 2009/0214785 | A1 * | 8/2009 | Arena | C23C 16/303 |
| | | | | 427/255.28 |
| 2010/0083902 | A1 * | 4/2010 | Kim | C23C 16/4586 |
| | | | | 118/723 R |
| 2012/0083100 | A1 * | 4/2012 | Bertram, Jr. | C23C 16/301 |
| | | | | 438/478 |

FOREIGN PATENT DOCUMENTS

| | | | |
|---|---|---|---|
| JP | 2010247963 | A | 11/2010 |
| JP | 2010250943 | A | 11/2010 |

* cited by examiner

HOT PLATE AND SUBSTRATE PROCESSING EQUIPMENT USING THE SAME

CROSS-REFERENCE TO RELATED APPLICATIONS

This application is the national phase under 35 U.S.C. § 371 of PCT International Application No. PCT/CN2011/082730 filed Nov. 23, 2011, which claims the benefit of China Patent Application No. 2010-10585727.2 filed Dec. 6, 2010, the entire contents of the aforementioned applications are hereby incorporated herein by reference.

FIELD OF THE INVENTION

The present invention relates to microelectronics process technology, and particularly to a hot plate and substrate processing equipment using the same.

BACKGROUND OF THE INVENTION

With the rapid development of microelectronics processing technology, users require higher quality of the product, which prompts enterprises to continuously improve the production equipment and process so as to meet new market demands. As an important microelectronic processing technology, the semiconductor integrated circuit industry is developed at a remarkable speed. Fabrication of the copper interconnect layer in the integrated circuit is a very critical technique among other processing; and at the current stage, such process is implemented using physical vapor deposition (which is called PVD for short).

Figure 1:
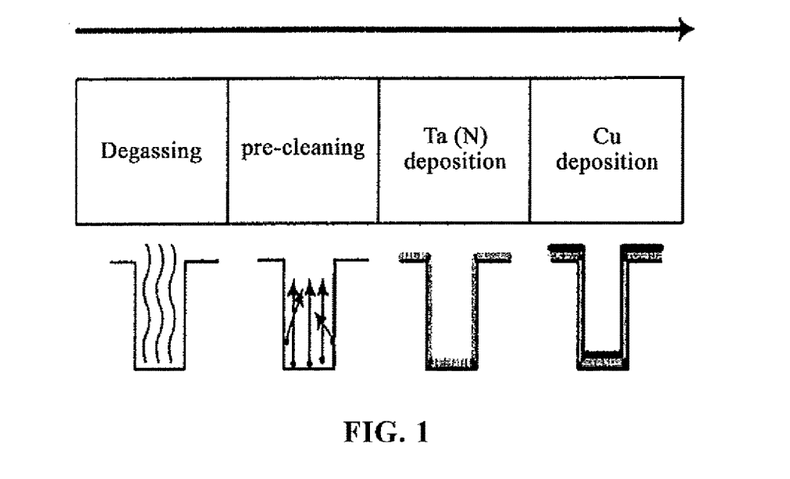
FIG. 1 is a schematic diagram of the main steps of current PVD process.

Referring to FIG. 1, which shows the main processing sequence of the PVD process. As shown in the figure, several steps such as degassing, pre-cleaning and Ta (N) deposition are performed before depositing Cu. Degas refers to the process step of heating-up the substrate to certain temperature (usually 350° C. or higher) in order to remove water vapor and other volatile impurities on the substrate. As the first step of the PVD process, the degas step has an important function. During heating the substrate, it is required to heat up the substrate rapidly while ensuring uniform heating-up of each area on the substrate. Otherwise, uniformity in the subsequent steps will be affected, or even causes the problem of substrate broken. In view of above, a dedicated substrate heating apparatus has been proposed.

Figure 2:
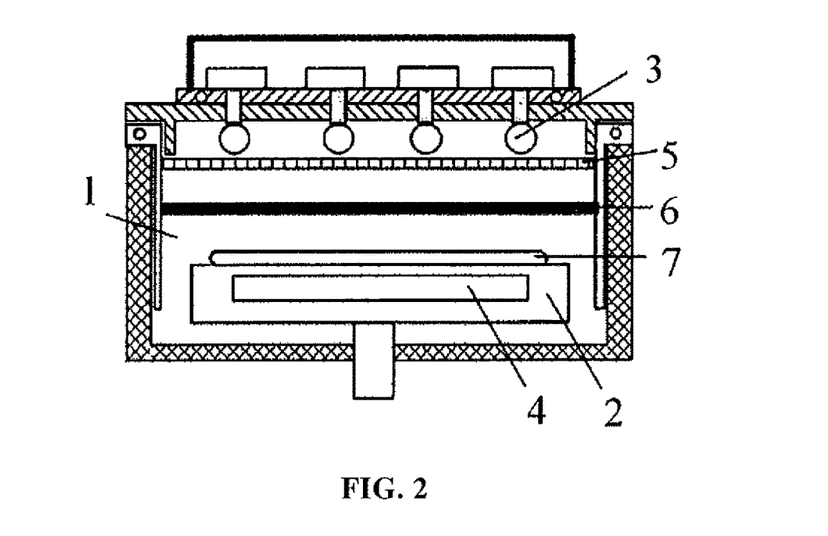
FIG. 2 is a schematic structural view of a commonly used substrate heating apparatus.

Referring to FIG. 2, which shows the schematic structural view of a widely used substrate heating apparatus. The apparatus comprises a heating chamber 1, a substrate support platform 2 provided inside the heating chamber 1, wherein a heating wire assembly 4 is provided in the interior of the substrate support platform 2; several heating lamps 3 are uniformly arranged in the upper portion of the heating chamber 1; a sealing quartz window 5 and a hot plate 6 are provided between the heating lamps 3 and the substrate support platform 2, the sealing quartz window 5 dividing the heating chamber 1 into vacuum and air potions, and wherein the heating lamps 3 are disposed in the air portion, while the hot plate 6 and the substrate support platform 2 are disposed in the vacuum portion.

The workflow of above apparatus is as follows: firstly, the substrate 7 to be heated is placed on the upper surface of the substrate support platform 2, then it is heated by both the heating lamps 3 and the heating wire assembly 4; the heating lamps 3 irradiate the hot plate 6 in the heat radiating manner and heat it up, the hot plate 6 subsequently heats the substrate 7 thereunder, such that the substrate 7 can be heated up rapidly and uniformly by means of the rapid heating-up characteristic of the heating lamps 3 and the heat spreading effect of the hot plate 6.

However, during the degas process of the substrate, the heat dissipation rate at the edge region of the substrate 7 is significantly higher than that on the center region of the substrate. Therefore, in order to keep a uniform heating rate for the edge region and the center region of the substrate 7, the edge region needs more heat irradiation so at to compensate the heat dissipation. To this end, the technicians adopt a solution whereby a partitioned control is provided to the heating lamps 3 for the edge region and those for the center region of the substrate 7, so as to achieve optimal heating effect on (on 或者 of) the substrate.

Figure 3:
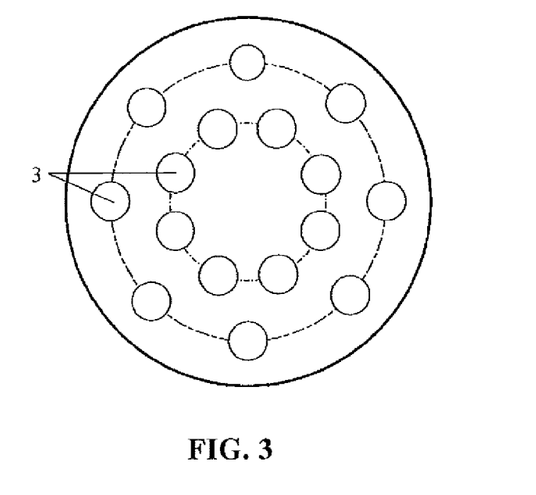
FIG. 3 is a schematic view showing the arrangement of the heating lamps in apparatus shown in FIG. 2.

Now referring to FIG. 3, which shows the arrangement of the heating lamps in the apparatus shown in FIG. 2. In the circular heating chamber, a plurality of the heating lamps 3 are arranged along the periphery of the circular chamber, and are set into an inner loop and an outer loop which correspond to the edge region and the center region of the substrate 7 respectively. By controlling the power of the heating lamps 3 in the inner and outer loops independently, a partitioned heating to each of the edge region and the center region of the substrate can be achieved. According to above partitioned heating scheme, by increasing the power of the heating lamps 3 for the edge region of the substrate 7, the heat dissipation at the edge region of the substrate 7 can be compensated to some extent. However, because of the hot plate 6 disposed between the heating lamps 3 and the substrate 7 in the substrate heating apparatus shown in FIG. 2, the heat radiation from the heating lamps 3 for both the edge region and the center region of the substrate 7 will be absorbed by the hot plate 6 firstly and cause the temperature of the hot plate 6 rise, then the substrate 7 will be heated by the lower surface of the hot plate 6 by the uniform heat radiation. That is, after the processing of the hot plate 6 to the heat generated from the heating lamps 3, the partitioned heating effect described above will be reduced, such that the heat dissipation at the edge region of the substrate 7 may not be compensated effectively, and the uniformity of the substrate heating-up will be affected.

SUMMARY OF THE INVENTION

The present invention provides a hot plate which can effectively compensate the heat dissipation at the edge region of the substrate, such that the heating-up speed of each region of the substrate may be uniform. Herein, the term "hot plate" refers to a heat transfer component which absorbs heat radiation from the heating sources and further provides uniform heating to the substrate.

The present invention also provides a substrate processing apparatus which can effectively compensate the heat dissipation at the edge region of the substrate, such that the heating-up speed of each region of the substrate may be uniform.

To this end, the present invention provides a hot plate comprising a central sub hot plate and at least one outer ring sub hot plate located around the central sub hot plate, wherein thermal insulation parts are provided between the central sub hot plate and the outer ring sub hot plate and between two adjacent outer ring sub hot plates, said thermal insulation parts may effectively prevent or reduce the heat conduction between adjacent sub hot plates.

The thermal insulation parts comprise annular grooves and/or gaps between adjacent sub hot plates.

Preferably, the thermal insulation parts comprise thermal insulation fillers filled in the annular grooves and/or gaps.

Said thermal insulation fillers include quartz, ceramic insulation, and heat insulation rubber.

A flange is provided at the edge of at least one of two adjacent sub hot plates; the adjacent sub hot plates are connected by means of the flange and an annular groove is formed at the location of the flange.

The materials of the central sub hot plate and the outer ring sub hot plate includes graphite and aluminum. The material of the central sub hot plate and the outer ring sub hot plate may be made of aluminum material, and sulfated hard anodization process may be performed on the surfaces thereof.

The number of the outer ring sub hot plate may be at least two, and said at least two outer ring sub hot plate may be socketed together.

The present invention further provides a substrate processing apparatus comprising a heating chamber, wherein heating lamps and the substrate support device opposed to the heating lamps are provided in the heating chamber, the hot plate according to the present invention is provided between the heating lamps and the substrate support device so as to provide a partitioned heating to the substrate.

The substrate processing apparatus comprises a physical vapor deposition device.

The present invention has the following advantages:

The hot plate according to the present invention comprises a central sub hot plate and at least one outer ring sub hot plate located around the central sub hot plate; in addition, by means of the thermal insulation parts provided between the central sub hot plate and the outer ring sub hot plate and between two adjacent outer ring sub hot plates, the heat conduction between adjacent sub hot plates may effectively prevented or reduced. When applying the hot plate according to the present invention in the apparatus for partitioned heating the substrate, the central sub hot plate may be disposed to corresponds to the central region of the substrate, and the outer ring sub hot plate may be disposed to corresponds to the edge region of the substrate. When increasing the power of the heating lamps at the edge regions of the substrate to compensate the heat dissipation at the edge of the substrate, by means of the thermal insulation effect of the thermal insulation (part) part at the edge of the outer ring sub hot plate, the temperature of the outer ring sub hot plate may be higher than that of the central sub hot plate, such that the heat dissipation at the edge of the substrate may be compensated, and the temperature distribution as well as the heating-up speed on the central and the edge regions of the substrate tend to be uniform. A uniform processing quality of the substrate may be expected in the subsequent process.

The substrate processing apparatus according to the present invention comprises a heating chamber, in which heating lamps, the substrate support device opposed to the heating lamps and the hot plate according to the present invention are provided. During the heating lamps are operated to provide a partitioned heating to the substrate, an effective control for the partitioned heating to the substrate may be implemented by the hot plate according to the present invention, so as to achieve an uniform temperature distribution as well as the heating-up speed of the substrate. Thus an uniform processing quality of the substrate may be expected in the subsequent process.

DETAILED DESCRIPTION OF THE PREFERRED EMBODIMENTS

In order to make the solutions of the present invention more apparent to persons skilled in the art, the hot plate and the substrate processing apparatus according to the present invention will be described in detail with reference to the accompany figures hereinafter.

The hot plate according to the present invention comprises a central sub hot plate and at least one outer ring sub hot plate located around the central sub hot plate; and thermal insulation part(s) is provided between the central sub hot plate and the outer ring sub hot plate and between two adjacent outer ring sub hot plates, the heat conduction between adjacent sub hot plates can effectively prevented or reduced by means of the thermal insulation part(s). Therefore, when the hot plate in the apparatus mentioned-above is applied for the partitioned heating to the substrate, a certain temperature difference can be generated among the sub hot plates, thus realizing the partitioned heating of the substrate. The typical partition method includes, making the outer ring sub hot plate to correspond to the edge region of the substrate, and making the heating lamps corresponding to the edge region of the substrate to generate higher heating power. Since the thermal insulation plate can provide effective thermal insulation between the outer ring sub hot plate(s) and the central sub hot plate of the hot plate, the temperature of the outer ring sub hot plate is higher, such that the edge region of the substrate can obtain more heat radiation than the center region, and the higher heat dissipation in the edge region as compared to the center region can be compensated. Finally a substantially equivalent temperature distribution as well as the heating-up speed in the edge region and the center region of the substrate are obtained, which is advantageous to achieve an uniform processing quality in subsequent processes.

Figure 4:
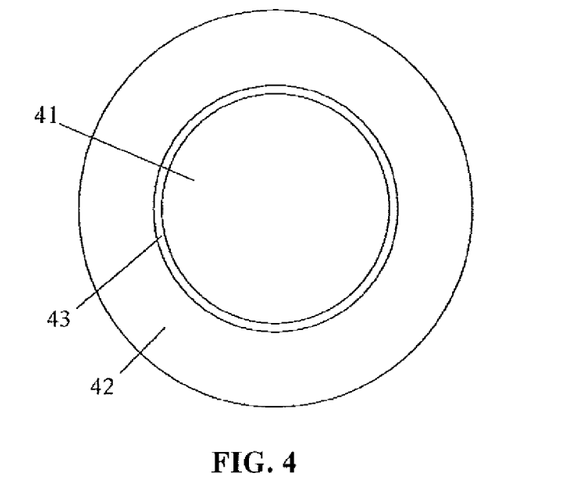
FIG. 4 a schematic structural view of the hot plate according to the present invention.

Referring to FIG. 4, which shows the schematic structural view of the hot plate according to the present invention. The hot plate comprises a central sub hot plate 41 and the outer ring sub hot plates 42 located around the central sub hot plate 41; and the thermal insulation part 43 is provided between the central sub hot plate 41 and the outer ring sub hot plate 42 for preventing or reducing the heat conduction there between. Here, the thermal insulation part 43 can have a structure of annular groove and/or gap etc, so as to reduce the contact area between the adjacent sub hot plates, and thus reduce the heat conduction between the adjacent sub hot plates.

Currently, the above mentioned central sub hot plate and the outer ring sub hot plate(s) are made of materials with good thermal conductivity such as graphite and aluminum. Preferably, when adopting aluminum, the surface of the central sub hot plate and the outer ring sub hot plate(s) can be sulfated hard anodized so as to increase the heat absorption ability of the aluminum material. It should be noted that, the material of the hot plate according to the present invention is not limited to above graphite and aluminum, any metal or non-metallic material with good thermal conductivity, high temperature resistance and high blackness (the ration between the actual radiation capacity of an object and that of the absolute blackbody at the same temperature; usually an object with higher blackness, its heat-absorbing capacity is also strong) can be used as the material of the hot plate according to the present invention, and shall dropped within the scope of the present invention.

In addition, in some preferred embodiments, some thermal insulation fillers with good thermal insulation performance can be filled in the annular groove and/or gap-shaped thermal insulation part, the thermal insulation fillers may be regarded as a portion of the thermal insulation part; currently, commonly used thermal insulation fillers include quartz, thermal insulation ceramic, thermal insulation rubber etc. In practice application, when the thermal insulation part is formed as annular groove, the thermal insulation fillers can be directly filled into the annular groove; and when the thermal insulation part is formed as annular gap, the thermal insulation fillers such as thermal insulation ceramic can be soldered to the central sub hot plate and the outer ring sub hot plate using specific soldering measures.

Figure 5:
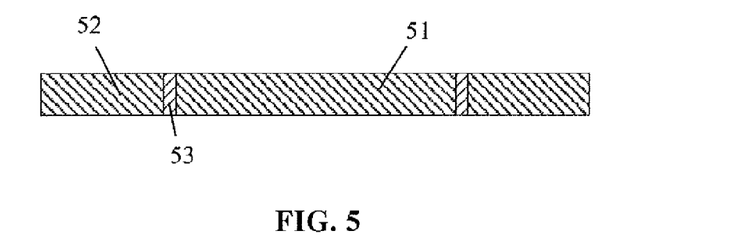
FIG. 5 is a cross-sectional view of the hot plate according to a first specific embodiment of the present invention.

Referring to FIG. 5, which shows a cross-sectional view of the hot plate according to a first specific embodiment of the present invention. In the present embodiment, the hot plate comprises a central sub hot plate 51 and an outer ring sub hot plate 52 located around the central sub hot plate 51, and a thermal insulation part 53 is provided there between. The thermal insulation part 53 has a structure of annular gap, thermal insulation fillers such as quartz, thermal insulation ceramic, thermal insulation rubber may be filled in the annular gap so as to provide better thermal insulation effect.

In addition, the material of the hot plate in the present embodiment is the same as or similar to that shown in FIG. 4, and the same advantageous effects can be achieved when applying the hot plate of the present embodiment to provide partitioned control to the heating to the substrate, and the description of which is omitted.

Figure 6:
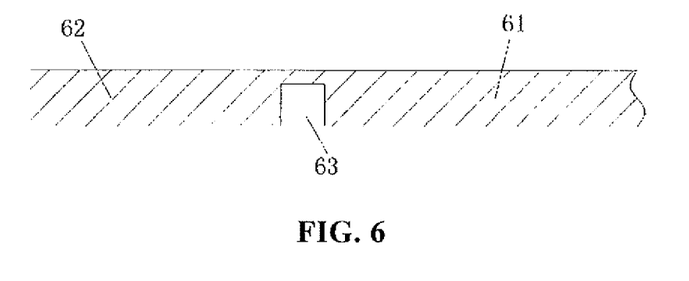
FIG. 6 is the cross-sectional view of the hot plate according to a second specific embodiment of the present invention.

Referring to FIG. 6, which shows a cross-sectional view of the hot plate according to a second specific embodiment of the present invention. Compared to the first specific embodiment shown in FIG. 5, the present embodiment is characterized by the annular groove structure of the thermal insulation part 63. Specifically, the hot plate of the present embodiment is formed as an integrated structure with an annular groove disposed on the lower surface of the integral hot plate as the thermal insulation part 63, so as to separate the hot plate into a central sub hot plate 61 and an outer ring sub hot plate 62. Preferably, the annular groove may be filled with thermal insulation fillers to increase thermal insulation capability of the thermal insulation part 63. Apparently, compared to the embodiment shown in FIG. 5, the present embodiment is simpler in structure and easy to implement, and the present embodiment can realize the similar advantageous. It is also understood that the annular groove in the present embodiment, which is the thermal insulation part 63, may be provided on the upper surface of the hot plate, which can also provide the thermal insulation and enable the hot plate to control the partitioned heating to the substrate.

The manner of forming the annular groove structure is not limited to above embodiments, it may also be implemented through a variety of solutions, for example, a flange may be provided at the edge of at least one of the adjacent sub hot plates, by means of the flange, the adjacent sub hot plates are connected while an annular groove may be formed at the position of the flange.

Figure 7:
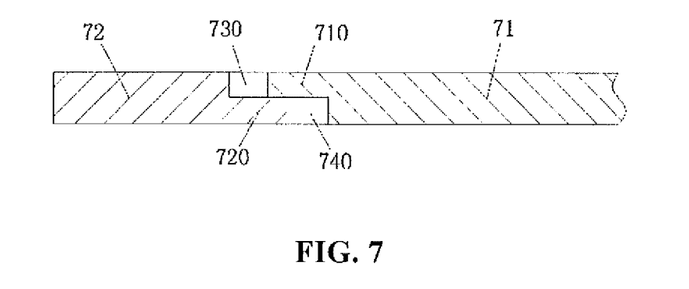
FIG. 7 is the cross-sectional view of the hot plate according to a third specific embodiment of the present invention.

Referring to FIG. 7, which shows a cross-sectional view of the hot plate according to a third specific embodiment of the present invention. In the present embodiment, the thermal insulation part is also settled into an annular groove structure, and the annular groove structure is distinct in the forming method. Specifically, a circle of outwardly directed flange 710 is disposed at the edge of an central sub hot plate 71, while a circle of inwardly directed flange 720 is disposed at the inner edge of the outer sub hot plate 72. The upper surface of the flange 710 is flush with that of the central sub hot plate 71, while the lower surface of the flange 720 is flush with that of the outer sub hot plate 72. By means of above flanges 710 and 720, the central sub hot plate 71 and the outer sub hot plate 72 are jointed together. As shown in FIG. 7, while the central sub hot plate 71 and the outer sub hot plate 72 are jointed, a certain annular groove structure may be formed at the position of the flange 710 and the flange 720, i.e., the annular groove 730 located on the upper surface of the hot plate and the annular groove 740 located on the lower surface of the hot plate. In addition, the central sub hot plate 71 and the outer sub hot plate 72 may be fixed with each other by mechanical connections such as soldering or screw connection; otherwise, the central sub hot plate 71 may be just lapped on the outer sub hot plate 72 due to the gravity, without any further processing. The present embodiment is advantageous in that the central sub hot plate 71 and the outer sub hot plate 72 may be made of different materials as they are independent assemblies, such that the uniform heating effects of hot plate the central region and the edge region of the hot plate are different.

Figure 8:
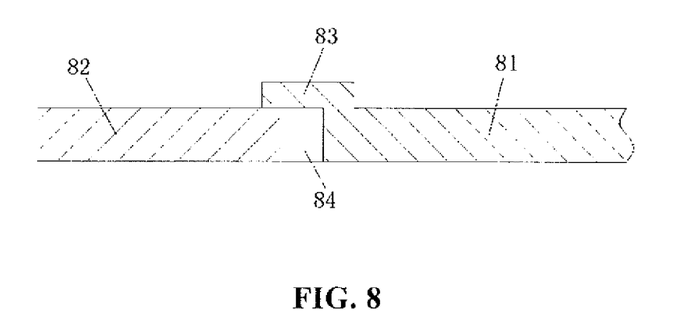
FIG. 8 is the cross-sectional view of the hot plate according to a fourth specific embodiment of the present invention.

Referring to FIG. 8, which shows a cross-sectional view of the hot plate according to a fourth specific embodiment of the present invention. In the present embodiment, the hot plate is also formed by independent central sub hot plate 81 and the outer sub hot plate 82, and is distinct from the embodiment shown in FIG. 7 in a different forming method of the annular groove as the thermal insulation part 84. That is, by providing a flange 83 only at the edge of the central sub hot plate 81 and lapping the central sub hot plate 81 on the outer sub hot plate 82, the structure of the outer sub hot plate 82 is simplified. Also, the hot plate of the present embodiment has the same or similar characteristic and performance as those of the previous embodiments, and the same advantageous effect may be achieved when applying control for partitioned heating to the substrate.

It should be noted that, the structure of the thermal insulation part is not limited to those described in above embodiments. For example, the thermal insulation part may be formed by combining the annular gap and the groove. Specifically, a portion of the structure of an annular thermal insulation part may be set as gaps, while the other portion of the annular thermal insulation part may be set as groove, said gap and the groove together forming a closed annular structure of the thermal insulation part. The specific structure of the gap and the groove may be the same or the like as described in above embodiments, and the description of which is omitted.

The hot plate in above embodiments is formed by the central sub hot plate and one outer sub hot plate, but the present invention is not limited to this. For example, one or more outer sub hot plates may be provided around the first outer sub hot plate, such that the respective outer sub hot plates are socketed together in turn, so as to obtain more partitioned controllable heating regions of the substrate.

Figure 9:
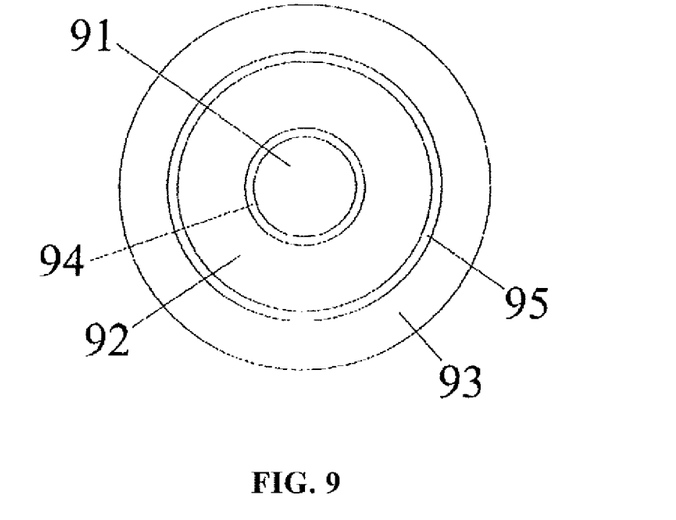
FIG. 9 is the schematic structural view of the hot plate according to a fifth specific embodiment of the present invention.

Referring to FIG. 9, which shows a cross-sectional view of the hot plate according to a fifth specific embodiment of the present invention. In the present embodiment, the hot plate comprises a central sub hot plate 91, a first outer ring sub hot plate 92, a second outer ring sub hot plate 93, a first thermal insulation part 94 provided between the central sub hot plate 91 and the first outer ring sub hot plate 92, and a second thermal insulation part 95 provided between the first outer ring sub hot plate 92 and the second outer ring sub hot plate 93. The sub hot plates and the thermal insulation parts have similar structure and performance to those described in the above embodiments, and the description of which is omitted.

As a summary, the hot plate according to the present invention comprises a plurality of sub hot plates, and the heat conduction between adjacent sub hot plates may be effectively prevented or reduced by means of the thermal insulation parts provided between the sub hot plates. Therefore, when applying partitioned heating to the substrate, an effective control for the partitioned heating to the substrate may be performed by using the hot plate according to the present invention. Particularly, an effective control for partitioned heating may be performed between the edge regions and the central regions of the substrate, such that the heat dissipation at the edge region of the substrate may be compensated, thus a substantially equivalent temperature distribution as well as the heating-up speed on the respective regions of the substrate may be obtained, which is advantageous to achieve an uniform processing quality in subsequent processes.

As another technical solution, the present invention also provides a substrate processing apparatus. The apparatus comprises at least a heating chamber; heating lamps and the substrate support device opposed to the heating lamps, which are provided in the heating chamber, wherein a hot plate according to the present invention is provided between the heating lamps and the substrate support device for applying the partitioned heating to the substrate.

Figure 10:
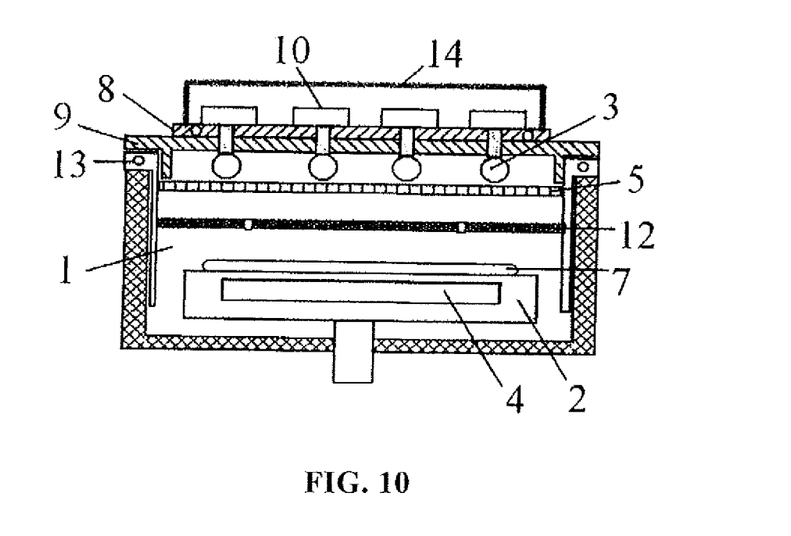
FIG. 10 a schematic structural view of a specific embodiment of the substrate processing apparatus according to the present invention.

Referring to FIG. 10, which shows a schematic structural view of a specific embodiment of the substrate processing apparatus according to the present invention. The apparatus comprises a heating chamber 1, a substrate support platform 2 provided inside the heating chamber 1, wherein a heating wire assembly 4 is provided in the interior of the substrate support platform 2, a heating lamp mounting plate 8 and a reflective plate 9 adhered thereto are provided in the upper portion of the heating chamber 1, the heating lamps 3 are connected to the heating lamp assemblies 10 above the heating lamp mounting plate 8 via the mounting holes in the heating lamp mounting plate 8 and the reflective plate 9, a sealing quartz window 5 and a hot plate 12 according to the present invention are provided between the heating lamps 3 and the substrate support platform 2, the sealing quartz window 5 dividing the heating chamber 1 into vacuum and air potions with the heating lamps 3 located in the air portion, while the hot plate 12 and the substrate support platform 2 located in the vacuum portion. A chamber shielding assembly 13 is further provided on the side walls of the heating chamber 1, and cooling water tubes are provide in the interior of the chamber shielding assembly 13 and the mounting plate 8 for preventing the reflective plate 9 and the side walls of the heating chamber 1 from overheating during operating. Besides, one protective cover 14 is provided outside each of the heating lamp assemblies 10 to protect the electrical components.

The arrangement of the heating lamps 3 is the same as that shown in FIG. 3, thus the temperatures at the edge region and the central region of the substrate 7 may be independently controlled, such that during the substrate heating processing, a certain temperature difference may be generated between the central sub hot plate and the outer sub hot plates, so as to compensate the heat dissipation at the edge region of the substrate 7. Specifically, the hot plate 12 is heated by the heating lamps 3, and the heating lamps 3 corresponding to the edge region of the substrate is caused to generate higher heating power. The power of the heating lamps 3 spreads uniformly in the range of the central sub hot plate and the outer sub hot plate of the hot plate 12. Because of the function of the thermal insulation part in the hot plate, the temperature of the outer sub hot plate is slightly higher than that of the central sub hot plate, thus the heat dissipation at the edge region of the substrate is compensated effectively. Therefore, using the substrate processing apparatus according to the present invention, an uniform temperature distribution and heating-up speed among the regions of the substrate may be reached during the substrate heating process, which leads to an uniform processing quality of the substrate.

In practical application, above substrate processing apparatus may be a physical vapor deposition apparatus, a substrate heating apparatus in the physical vapor deposition apparatus or a substrate heating apparatus for other substrate process.

It shall be understood that, above embodiments are only illustrations for explaining the principle of the present invention. The present invention is not limited thereto. Various modifications and improvements are apparent to persons skilled in the art without departing from the spirit and contents of the present invention, and these modifications and improvements will fall within the scope of the technical solutions of the present invention.

What is claimed is:

1. A hot plate for heating a substrate, comprising:
   a central sub hot plate;
   at least one outer ring sub hot plate located around the central sub hot plate; and
   at least one thermal insulation part provided between the central sub hot plate and the outer ring sub hot plate and between two adjacent outer sub hot plates, said thermal insulation part is used to prevent or reduce the heat conduction between adjacent sub hot plates;
   wherein an edge of the central sub hot plate comprises a first flange, the first flange covers at least a portion of a topmost surface of the outer ring sub hot plate, and a topmost surface of the first flange is higher than the topmost surface of the outer ring sub hot plate, and
   the hot plate compensates the heat dissipation at the edge of the substrate, by a thermal insulation effect of the thermal insulation part at the edge of the outer ring sub hot plate, the temperature of the outer ring sub hot plate may be higher than that of the central sub hot plate, such that the heat dissipation at the edge of the substrate being compensated, and the temperature distribution as well as the heating-up speed on a central region and the edge region of the substrate are substantially uniform.

2. The hot plate according to claim 1, characterized in that, the materials of the central sub hot plate and the outer ring sub hot plate include at least one of graphite and aluminum.

3. The hot plate according to claim 2, characterized in that, the materials of the central sub hot plate and the outer ring sub hot plate are made of aluminum material, and the surfaces thereof are sulfated hard anodized.

4. The hot plate according to claim 1, characterized in that, the number of the at least one outer ring sub hot plate is at least two, and said at least two outer ring sub hot plate are socketed together.

5. The hot plate according to claim 1, further comprising:
an annular groove formed on a lower surface of the hot plate located between the central sub hot plate and the outer ring sub hot plate;
wherein a thermal insulation filler is filled in the annular groove to form the thermal insulation part.

6. The hot plate according to claim 5, wherein the thermal insulation filler includes at least one of quartz, ceramic insulation, and heat insulation rubber.

7. A substrate processing apparatus comprising:
a heating chamber;
at least two heating lamps;
a substrate support device opposed to the at least two heating lamps provided in the heating chamber; and
a hot plate disposed between the at least two heating lamps and the substrate support device so as to apply a partitioned heating to the substrate, the hot plate having a central sub hot plate and at least one outer ring sub hot plate located around the central sub hot plate,
wherein at least one thermal insulation part is provided between the central sub hot plate and the outer ring sub hot plate and between two adjacent outer sub hot plates, said thermal insulation part is used to prevent or reduce the heat conduction between adjacent sub hot plates; during the heating the at least two heating lamps are operated to provide a partitioned heating to the substrate, to control for the partitioned heating to the substrate as may be implemented by the hot plate, so as to achieve a uniform temperature distribution as well as the heating-up speed of the substrate, and
an edge of the central sub hot plate comprises a first flange, the first flange covers at least a portion of a topmost surface of the outer ring sub hot plate, and a topmost surface of the first flange is higher than the topmost surface of the outer ring sub hot plate.

8. The substrate processing apparatus according to claim 7, characterized in that, the substrate processing apparatus comprises a physical vapor deposition device.

9. The substrate processing apparatus according to claim 7, wherein the materials of the central sub hot plate and the outer ring sub hot plate include at least one of graphite and aluminum.

10. The substrate processing apparatus according to claim 9, wherein the materials of the central sub hot plate and the outer ring sub hot plate are made of aluminum material, and the surfaces thereof are sulfated hard anodized.

11. The substrate processing apparatus according to claim 7, wherein the number of the at least one outer ring sub hot plate is at least two, and said at least two outer ring sub hot plate are socketed together.

12. The substrate processing apparatus according to claim 7, wherein the hot plat further comprises:
an annular groove formed on a lower surface of the hot plate located between the central sub hot plate and the outer ring sub hot plate;
wherein a thermal insulation filler is filled in the annular groove to form the thermal insulation part.

13. The substrate processing apparatus according to claim 12, wherein the thermal insulation filler includes at least one of quartz, ceramic insulation, and heat insulation rubber.

14. A heating process chamber comprising:
a chamber body;
a substrate support platform provided inside the chamber body for supporting a substrate;
a hot plate provided inside the chamber body and spatially above the substrate support platform and the substrate, the hot plate comprising:
a central sub hot plate; and
at least one outer ring sub hot plate located around the central sub hot plate;
wherein an annular groove is formed on a lower surface of the hot plate located between the central sub hot plate and the outer ring sub hot plate; and
the central sub hot plate comprises a first flange at an outer edge of the central sub hot plate, the first flange covers at least a portion of a topmost surface of the outer ring sub hot plate, and a topmost surface of the first flange is higher than the topmost surface of the outer ring sub hot plate;
a sealing quartz window for dividing the chamber body into a vacuum portion and an air portion; and
a lamp set provided above the sealing quartz window for providing a heating source of the hot plate.

15. The heating process chamber according to claim 14, wherein a thermal insulation filler is filled in the annular groove to form a thermal insulation part.

* * * * *